United States Patent
Lin et al.

(10) Patent No.: US 12,199,033 B2
(45) Date of Patent: *Jan. 14, 2025

(54) EXTENDED VIA SEMICONDUCTOR STRUCTURE AND DEVICE

(71) Applicant: Taiwan Semiconductor Manufacturing Co., Ltd., Hsinchu (TW)

(72) Inventors: Hung Hsun Lin, Hsinchu (TW); Wei-Chun Hua, Hsinchu (TW); Wen-Chu Huang, Hsinchu (TW); Yen-Yu Chen, Hsinchu (TW); Che-Chih Hsu, Hsinchu (TW); Chinyu Su, Hsinchu (TW); Wen Han Hung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/180,079

(22) Filed: Mar. 7, 2023

(65) Prior Publication Data
US 2023/0223335 A1   Jul. 13, 2023

Related U.S. Application Data

(60) Continuation of application No. 17/870,213, filed on Jul. 21, 2022, now Pat. No. 12,087,627, which is a
(Continued)

(51) Int. Cl.
*H01L 23/52* (2006.01)
*H01L 21/027* (2006.01)
(Continued)

(52) U.S. Cl.
CPC ...... *H01L 23/5226* (2013.01); *H01L 21/0276* (2013.01); *H01L 21/76802* (2013.01);
(Continued)

(58) Field of Classification Search
CPC ......... H01L 21/76877; H01L 21/76802; H01L 21/76829; H01L 21/76832; H01L 21/0276;
(Continued)

(56) References Cited

U.S. PATENT DOCUMENTS

| 11,616,013 B2 * | 3/2023 | Lin ................ H01L 21/76802 |
| | | 257/531 |
| 2006/0158302 A1 | 7/2006 | Jeong et al. |

(Continued)

FOREIGN PATENT DOCUMENTS

| KR | 20170059868 A | 5/2017 |
| KR | 20190055005 A | 5/2019 |

*Primary Examiner* — Shouxiang Hu
(74) *Attorney, Agent, or Firm* — Seed IP Law Group LLP

(57) ABSTRACT

A device includes a substrate, a first conductive layer on the substrate, a first conductive via, and further conductive layers and conductive vias between the first conductive via and the substrate. The first conductive via is between the substrate and the first conductive layer, and is electrically connected to the first conductive layer. The first conductive via extends through at least two dielectric layers, and has thickness greater than about 8 kilo-Angstroms. An inductor having high quality factor is formed in the first conductive layer and also includes the first conductive via.

20 Claims, 12 Drawing Sheets

Related U.S. Application Data division of application No. 16/900,567, filed on Jun. 12, 2020, now Pat. No. 11,616,013.

(51) Int. Cl.
  *H01L 21/768* (2006.01)
  *H01L 23/522* (2006.01)
  *H01L 23/64* (2006.01)
  *H01L 23/66* (2006.01)
  *H01L 49/02* (2006.01)

(52) U.S. Cl.
  CPC .... *H01L 21/76877* (2013.01); *H01L 23/5227* (2013.01); *H01L 23/645* (2013.01); *H01L 23/66* (2013.01); *H01L 28/10* (2013.01)

(58) Field of Classification Search
  CPC .......... H01L 21/76843; H01L 23/5227; H01L 28/10; H01L 23/645; H01L 23/49822; H01L 23/5225; H01L 23/528; H01L 23/5226; H01L 23/66
  See application file for complete search history.

(56) References Cited

U.S. PATENT DOCUMENTS

| | | |
|---|---|---|
| 2013/0057267 A1 | 3/2013 | Klein |
| 2014/0041173 A1 | 2/2014 | Yen et al. |
| 2015/0115404 A1 | 4/2015 | Hsueh et al. |
| 2017/0148559 A1 | 5/2017 | Choi |
| 2017/0149404 A1 | 5/2017 | Tsai et al. |
| 2017/0162501 A1 | 6/2017 | Yi et al. |
| 2019/0148287 A1 | 5/2019 | Chang et al. |
| 2019/0206789 A1 | 7/2019 | Kuwajima et al. |
| 2020/0144358 A1 | 5/2020 | Koduri |
| 2021/0151428 A1 | 5/2021 | Dutta et al. |

* cited by examiner

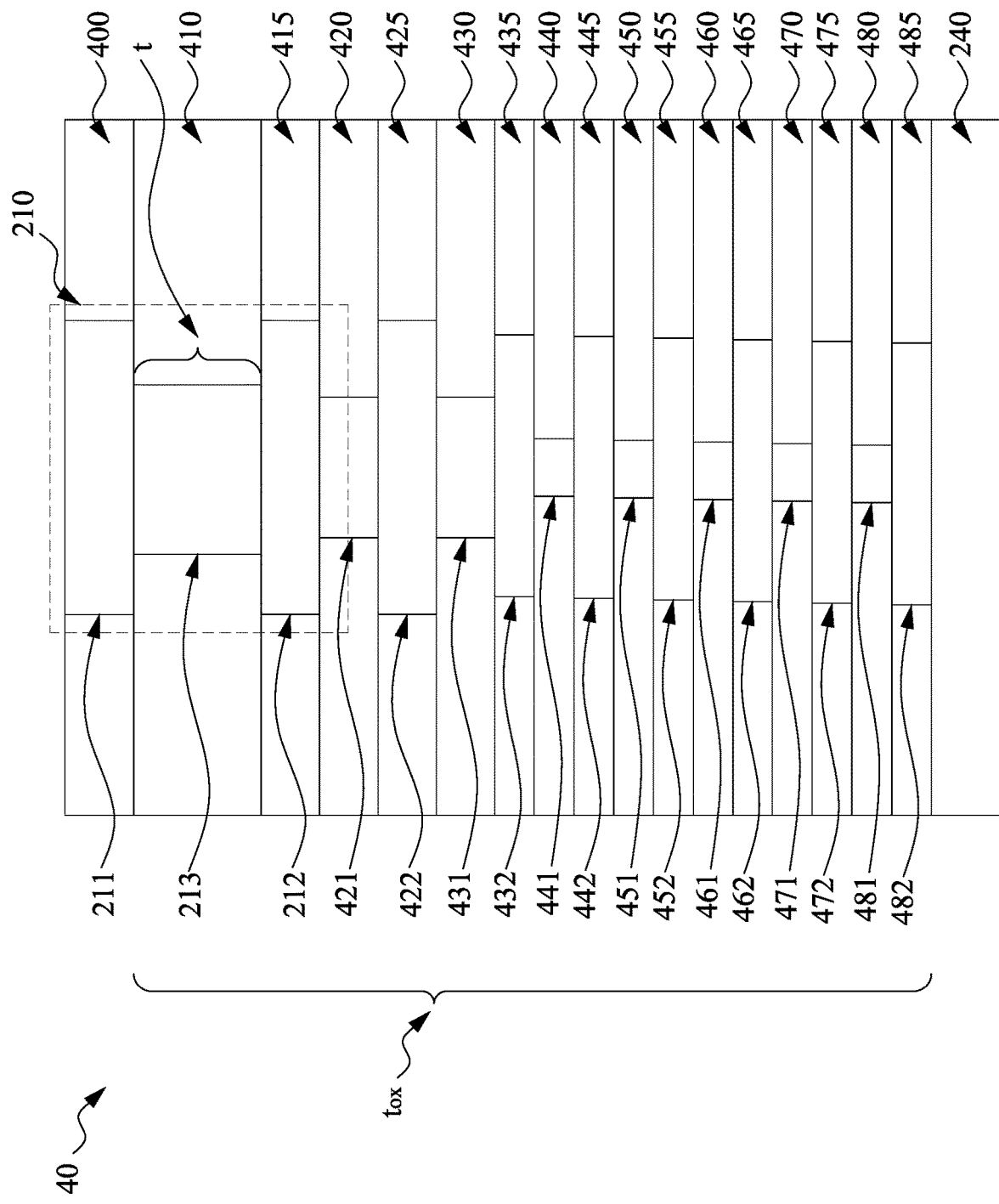

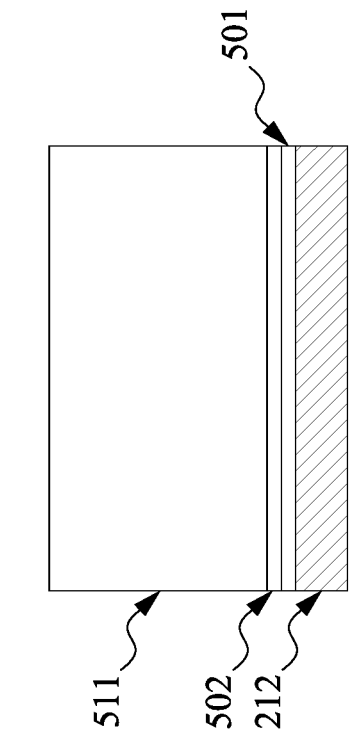
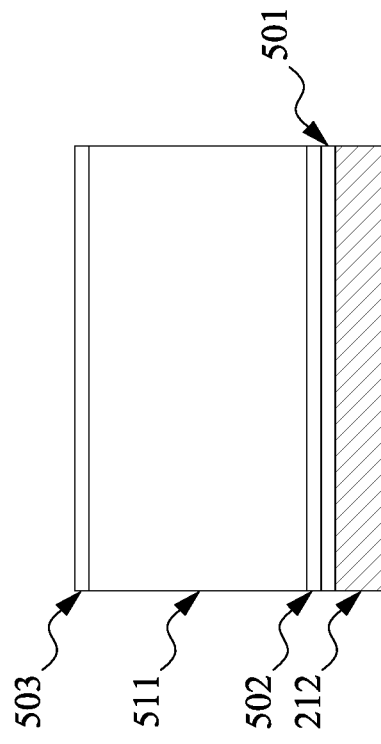
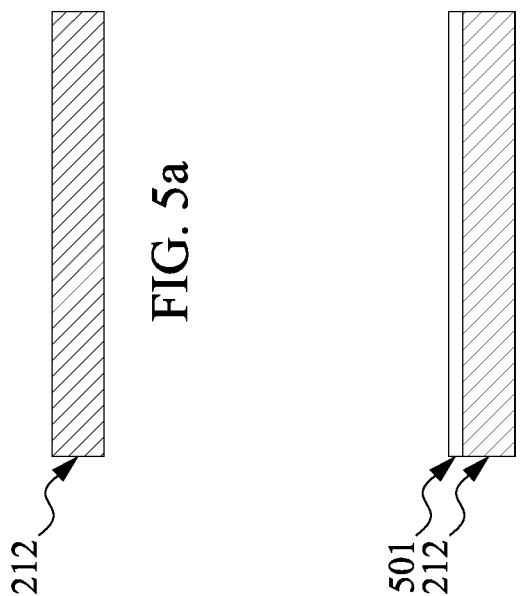
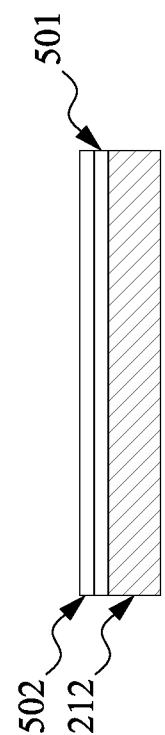

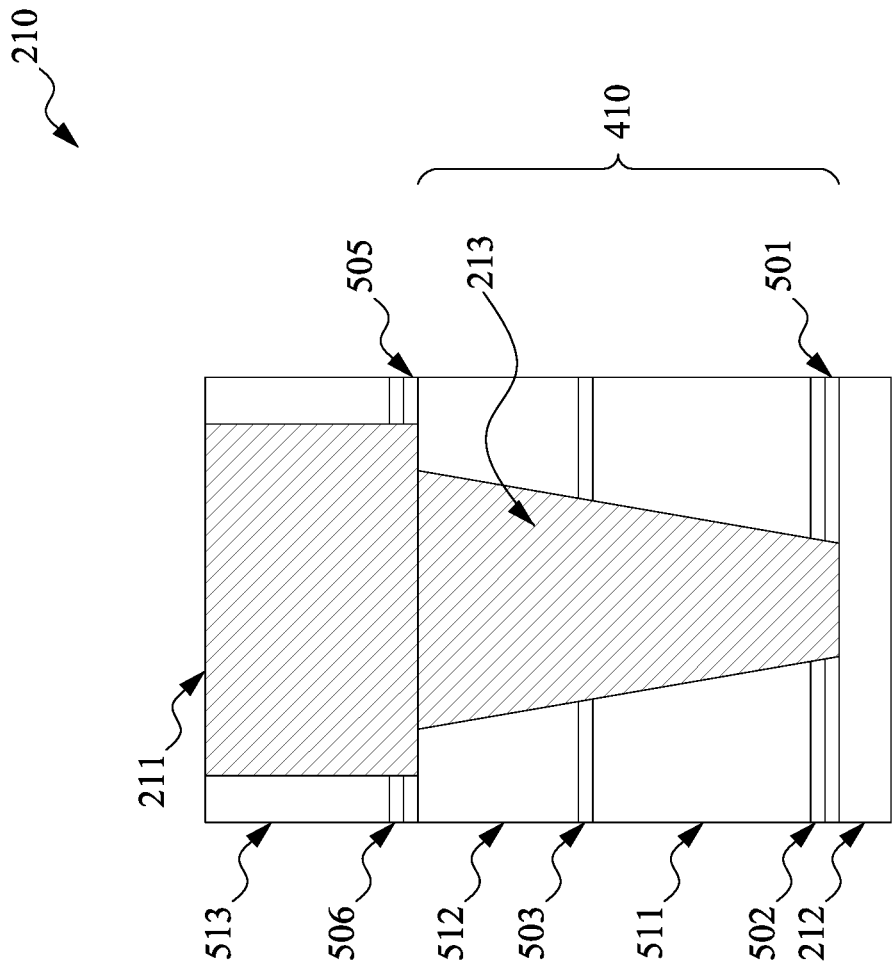

EXTENDED VIA SEMICONDUCTOR STRUCTURE AND DEVICE

BACKGROUND

Inductors are building blocks for integrated circuits. An inductor fabricated in an integrated circuit process generally includes a conductive spiral coil, input and output traces and pads, all of which are formed at least partially in the uppermost metal layer of an integrated circuit. One performance metric of inductors is a quality, or "Q," factor. In radio frequency electronics, the Q factor can be seen as a measure of signal selectivity, the ability to attenuate unwanted signals, particularly those adjacent to a desired frequency band, while simultaneously retaining signals in the desired frequency band. Increasing the Q factor improves the signal selectivity, and is an important objective in the design of inductors fabricated in integrated circuit processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a cross-sectional diagram of a structure of the inductor of FIG. 1 in accordance with some embodiments.

DETAILED DESCRIPTION

Figure 1:
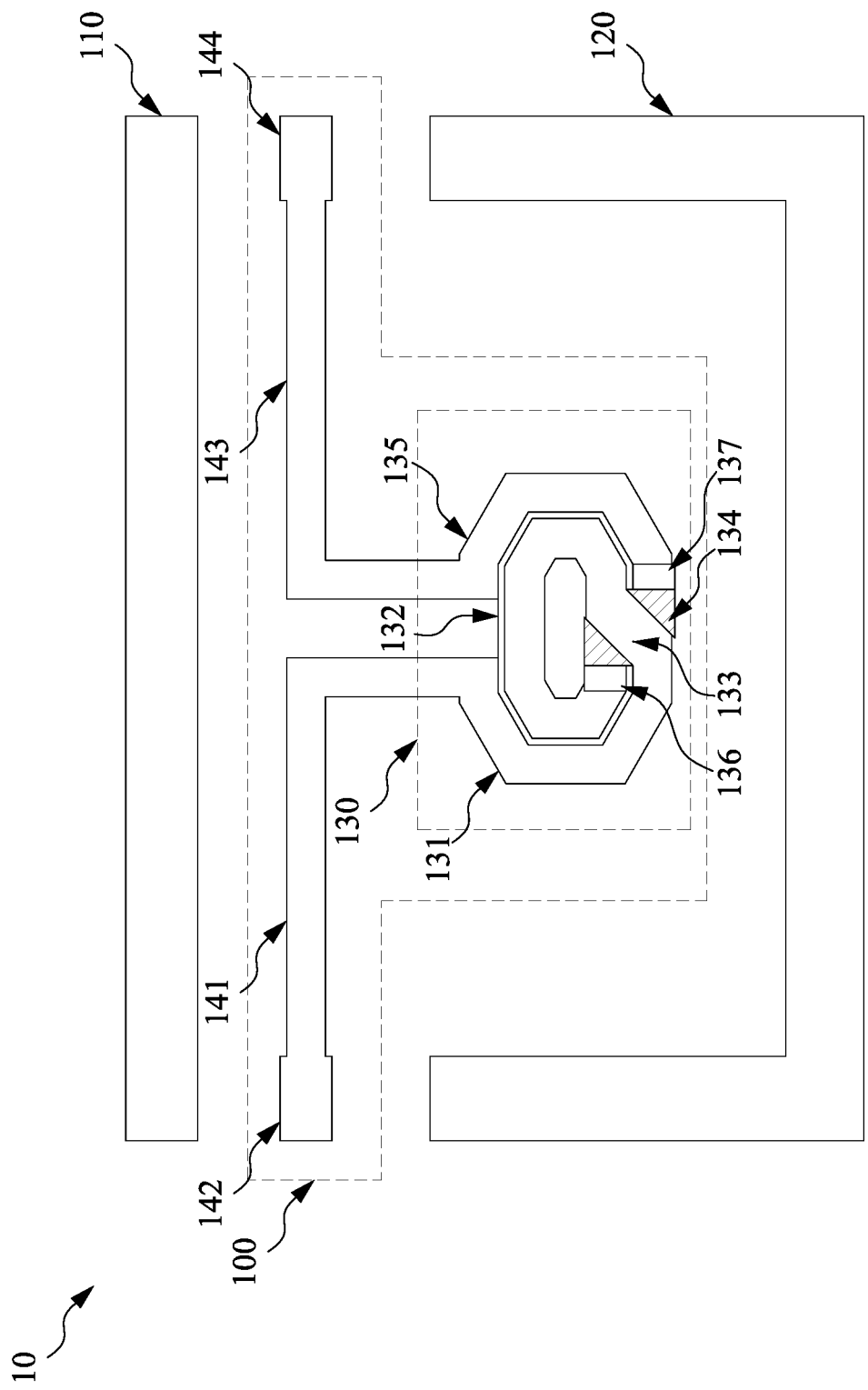
FIG. 1 is a top view of an inductor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "top metal layer" may be used herein to refer to the metal layer of an integrated circuit chip (or simply "chip") most distal a substrate of the chip, and/or the metal layer of the chip above which no further metal layers are formed. The term "bottom metal layer" may be used herein to refer to the metal layer of the chip most proximal the substrate, and/or the metal layer of the chip having no metal layer between itself and the substrate. The term "intermediate metal layer" may be used herein to refer to any metal layer between the top metal layer and the bottom metal layer.

The term "upper conductive via" may be used herein to refer to any conductive via in direct contact with the top metal layer. The term "intermediate conductive via" may be used herein to refer to any conductive via not having a direct contact with the top metal layer.

On-chip inductor quality factor is closely correlated with various desirable performance metrics in integrated circuit design, including but not limited to radio frequency sideband rejection and voltage controlled oscillator phase noise reduction. Substrate loss and self-resonance are two environmental challenges that obstruct designers' ability to produce on-chip inductors exhibiting high quality factor. Increase in oxide capacitance $C_{ox}$, the capacitance between the inductor and the substrate over which it is formed, effectively reduces both the substrate loss and the self-resonance. Oxide capacitance $C_{ox}$ is inversely proportional to oxide thickness $t_{ox}$, suggesting that quality factor can be increased by increasing oxide thickness $t_{ox}$ of the inductor.

Various embodiments of integrated circuit structures and process flows directed toward increasing oxide thickness $t_{ox}$ with a view to reducing substrate loss factor and self-resonance factor to increase quality factor of on-chip inductors are described below. In some embodiments, oxide thickness $t_{ox}$ is increased by extending an upper conductive via through at least two dielectric layers. In some embodiments, the oxide thickness is further increased by extending the upper conductive via through at least one etch stop layer positioned between the at least two dielectric layers. Q factor for a 0.5 nano-Henry on-chip inductor is greater than about 22 when using the structures and processes described herein.

FIG. 1 is a top view of inductor circuit 10 in accordance with some embodiments. Inductor circuit 10 is an on-chip inductor in a chip. Inductor circuit 10 is fabricated in an integrated circuit fabrication process. Inductor circuit 10 is on a substrate of the chip. In some embodiments, the substrate is a semiconductor substrate, such as a bulk semiconductor, a semiconductor-on-insulator (SOI) substrate, or the like, which may be doped with a p-type or an n-type dopant or undoped. In some embodiments, the substrate is a wafer, such as a silicon wafer. An SOI substrate generally includes a layer of semiconductor material formed on an insulator layer. In some embodiments, the insulator layer is a buried oxide (BOX) layer, a silicon oxide layer, or the like. The insulator layer is provided on a substrate, typically a silicon or glass substrate. In some embodiments, a multi-layered or gradient substrate is used. In some embodiments, the semiconductor material of the substrate includes silicon and/or germanium. In some embodiments, the semiconductor material is a compound semiconductor including silicon carbide, gallium arsenic, gallium phosphide, indium phosphide, indium arsenide, and/or indium antimonide. In some embodiments, the substrate is an alloy semiconductor including SiGe, GaAsP, AlInAs, AlGaAs, GaInAs, GaInP, and/or GaInAsP. Combinations of the above may be utilized as the substrate in some embodiments.

The substrate will generally include integrated circuit devices (not shown). In some embodiments, the integrated circuit devices include transistors, diodes, capacitors, resistors, the like, or combinations thereof formed in and/or on the substrate. The integrated circuit devices may be formed using any suitable methods.

The inductor circuit 10 includes an inductor 100 having any suitable shape or architecture. In some embodiments, the inductor 100 may be a symmetrical or generally symmetrical spiral inductor 100 having an octagonal-shaped coil (or simply "coil") 130. First trace 141 and first pad 142, and second trace 143 and second pad 144 provide input and output electrical signal connection to coil 130. In some embodiments, first guard ring segment 110 and second guard ring segment 120 partially surround spiral inductor 100, as shown in FIG. 1. In some embodiments, the first guard ring segment 110 and/or second guard ring segment 120 may be omitted. In some embodiments, coil 130 is formed at least partially in the top metal layer of the chip. Forming coil 130 in the top metal layer can reduce parasitic capacitances, which are generally inversely proportional to the distance, or "oxide thickness" ($t_{ox}$), between the coil and the substrate over which the coil is formed.

Throughout the description, reference to inductor circuit 10 is not limited to the symmetrical spiral inductor architecture shown in FIG. 1. Other inductor architectures including at least asymmetrical spiral inductors may be utilized as the inductor 100 in the inductor circuit 10 in various embodiments, and the techniques described for improving inductor Q factor are applicable to the other inductor architectures without significant modification envisioned. Symmetrical spiral inductors generally trade off lower self-resonant frequency against higher inductance, higher Q factor and lower series resistance.

Other inductor shapes including at least hexagonal, square or circular may be utilized as the inductor 100 in the inductor circuit 10 in various embodiments, and the techniques described for improving inductor Q factor are applicable to the other inductor shapes without significant modification envisioned. Whereas circle-shaped inductors exhibit favorable Q factor, few or no semiconductor fabrication processes support shapes employing curved sides. Square-shaped inductors are generally more compact, easily manufactured, and exhibit higher inductance for a given area, but suffer lower Q factor. Octagonal-shaped and hexagonal-shaped inductors strike a desirable balance between manufacturability, Q factor and inductance. Again, any of the shapes will benefit from application of the Q factor enhancing techniques described herein. Other examples of a substantially closed geometric pattern would include a box-within-a-box pattern (square or rectangular) or other polygon spiral pattern, an irregularly shaped spiral pattern, nested parallelogram or polygon patterns, and the like.

In some embodiments, inductor circuit 10 has a Q factor of greater than about 21, greater than about 22, greater than about 23, or greater than about 24. In some embodiments, inductor circuit 10 has inductance of less than about 1 nano-Henry, less than about 0.5 nano-Henries, or less than about 0.1 nano-Henries. Lower inductance can be desirable to achieve higher operating frequency.

Spiral inductor 100 of inductor circuit 10 includes coil 130, first trace 141, first pad 142, second trace 143 and second pad 144.

First coil segment 131 of coil 130 is a first outer ring segment of coil 130. In some embodiments, first coil segment 131 includes at least 3 bends, at least 4 bends or at least 5 bends. A "bend" as described herein can refer to a change in direction of a segment of the coil 130. A circular inductor would thereby have infinite bends, and a polygonal inductor would have some finite number of bends. In some embodiments, first coil segment 131 is monolithically formed with first trace 141. In some embodiments, first coil segment 131 is electrically connected to first trace 141 by way of a conductive via.

Second coil segment 132 is an inner ring segment of coil 130. In some embodiments, second coil segment 132 includes at least 4 bends, at least 6 bends or at least 8 bends. In some embodiments, second coil segment 132 is monolithically formed with first coil segment 131 and/or first trace 141, or electrically connected thereto by way of a conductive via.

Third coil segment 133 is a first bridge segment electrically connected to first coil segment 131 and second coil segment 132. In some embodiments, third coil segment 133 is monolithically formed with first coil segment 131 and second coil segment 132, or electrically connected thereto by way of a conductive via.

Fifth coil segment 135 is a second outer ring segment of coil 130. In some embodiments, fifth coil segment 135 includes at least 3 bends, at least 4 bends, or at least 5 bends. In some embodiments, fifth coil segment 135 is monolithically formed with second trace 143. In some embodiments, fifth coil segment 135 is electrically connected to second trace 143 by way of a conductive via.

Fourth coil segment 134 is a second bridge segment electrically connected to fifth coil segment 135 and second coil segment 132. Fourth coil segment 134 crosses under third coil segment 133, and is electrically isolated from third coil segment 133. In some embodiments, fourth coil segment 134 is formed in at least one intermediate metal layer.

Sixth coil segment 136 is a first intermetal connection region partially overlapping second coil segment 132 and fourth coil segment 134. In some embodiments, sixth coil segment 136 includes one or more conductive vias and one or more metal contacts extending from second coil segment 132 to fourth coil segment 134. Sixth coil segment 136 establishes an electrical connection between second coil segment 132 and fourth coil segment 134.

Seventh coil segment 137 is a second intermetal connection region partially overlapping fifth coil segment 135 and fourth coil segment 134. In some embodiments, seventh coil segment 137 includes one or more conductive vias and one or more metal contacts extending from fifth coil segment 135 to fourth coil segment 134. Seventh coil segment 137 establishes an electrical connection between fifth coil segment 135 and fourth coil segment 134.

In some embodiments, first pad 142, first trace 141, first coil segment 131, third coil segment 133, second coil segment 132, fifth coil segment 135, second trace 143 and second pad 144 ("the segments") are formed in the top metal layer of the chip. In some embodiments, the segments are further formed in at least one intermediate metal layer and/or the bottom metal layer, the included metal layers in the segments being interconnected by conductive vias. Forming the segments in more than one metal layer reduces series resistance of spiral inductor 100 by effectively increasing cross-sectional area of the current path through the spiral inductor 100 (resistance is inversely proportional to cross-sectional area), which is desirable in some circuit applications.

In some embodiments, any of first pad 142, first trace 141, first coil segment 131, third coil segment 133, second coil segment 132, fifth coil segment 135, second trace 143 and second pad 144 includes at least one upper conductive via extending from the top metal layer through at least two dielectric layers. Each upper conductive via in spiral inductor 100 is a single, continuous structure. In some embodiments, formation of upper conductive vias is accomplished using no more than one electroless copper plating step.

First guard ring segment 110 and second guard ring segment 120 form a guard ring around coil 130. The guard ring attenuates radio frequency noise emitted by coil 130. The attenuation protects nearby circuits which may be sensitive to such electromagnetic interference generated by coil 130.

Figures 2, 3:
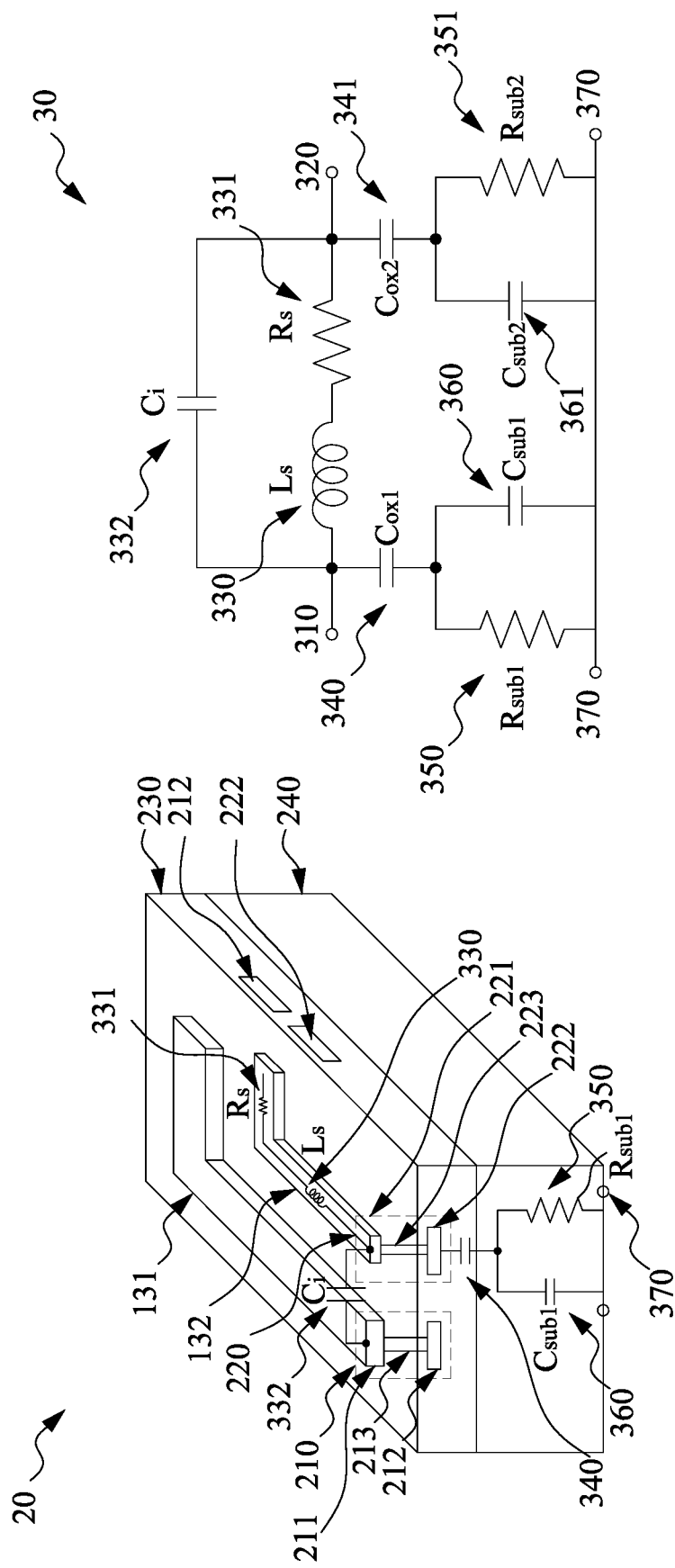
FIG. 2 is a perspective view of adjacent bends of the inductor of FIG. 1 in accordance with some embodiments.
FIG. 3 is a circuit diagram of the inductor of FIG. 1 in accordance with some embodiments.

FIG. 2 is a perspective view of adjacent bends of the inductor of FIG. 1 in accordance with some embodiments. FIG. 3 is a circuit diagram of the inductor of FIG. 1 in accordance with some embodiments. Two metal layers are shown in FIG. 2 for ease of illustration. Other embodiments may include more than two metal layers.

Inductor section 20 includes substrate 240 and dielectric layer 230 on a first side of substrate 240. Portions of first coil segment 131 and second coil segment 132 are shown in FIG. 2, as well as front and side cutaways. Equivalent circuit components including inductance 330, resistance 331, capacitance 332, capacitance 340, resistance 350, and capacitance 360 are also shown overlaid on the perspective view in FIG. 2 for ease of description.

Equivalent circuit 30 shown in FIG. 3 is a pi-type lumped physical model for approximating electrical behavior of on-chip inductors, such as spiral inductor 100.

Inductance 330 models series inductance of spiral inductor 100. A first terminal of inductance 330 is electrically connected to a first terminal of capacitance 332, a first terminal of capacitance 340, and first interface terminal 310. A second terminal of inductance 330 is electrically connected to a first terminal of resistance 331.

Resistance 331 models series resistance of spiral inductor 100. A first terminal of resistance 331 is electrically connected to the second terminal of inductance 330. A second terminal of resistance 331 is electrically connected to a second terminal of capacitance 332, a first terminal of capacitance 341, and second interface terminal 320.

Capacitance 332 represents series capacitance of spiral inductor 100. Capacitance 332 generally models capacitive coupling in spiral inductor 100. One type of capacitive coupling is shown in FIG. 2 between first coil segment 131 and second coil segment 132. Overall capacitive coupling represented by capacitance 332 is generally thought to be dominated by the crossover of third coil segment 133 and fourth coil segment 134 of coil 130 shown in FIG. 1. A first terminal of capacitance 332 is electrically connected to first interface terminal 310, the first terminal of inductance 330, and the first terminal of capacitance 340. A second terminal of capacitance 332 is electrically connected to the second terminal of resistance 331, the first terminal of capacitance 341, and second interface terminal 320.

Capacitance 340 and capacitance 341 model oxide capacitance of spiral inductor 100 distributed at first interface terminal 310 and second interface terminal 320, respectively. The oxide capacitance of spiral inductor 100 is generally modeled as equally distributed: $C_{ox1}=C_{ox2}=C_{ox}$. Capacitance 340 and capacitance 341 represent capacitance of dielectric layer 230 between first coil segment 131 and substrate 240, and second coil segment 132 and substrate 240, respectively.

Resistance 350 and resistance 351 model resistance of substrate 240 from dielectric layer 230 to biasing terminal 370, corresponding to resistance from the second terminal of capacitance 340 to biasing terminal 370 and from the second terminal of capacitance 341 to biasing terminal 370, respectively. Capacitance 360 and capacitance 361 model capacitance of substrate 240 from dielectric layer 230 to biasing terminal 370, corresponding to capacitance from the second terminal of capacitance 340 to biasing terminal 370 and from the second terminal of capacitance 341 to biasing terminal 370, respectively. Resistance 350 and resistance 351 are generally modeled as equally distributed: $R_{sub1}=R_{sub2}=R_{sub}$. Capacitance 360 and capacitance 361 are generally modeled as equally distributed: $C_{sub1}=C_{sub2}=C_{sub}$.

Q factor of spiral inductor 100 is approximated by equivalent circuit 30 as:

$$Q = \frac{\omega L_s}{R_s} \times \frac{R_p}{R_p + \left[\left(\frac{\omega L_s}{R_s}\right)^2\right] R_s} \times \left[1 - \frac{R_s^2(C_i + C_p)}{L_s} - \omega^2 L_s(C_i + C_p)\right] \quad (1)$$

$$R_p = \frac{1}{\omega^2 C_{ox}^2 R_{sub}} + \frac{R_{sub}(C_{ox} + C_{sub})^2}{C_{ox}^2} \quad (2)$$

$$C_p = C_{ox} \frac{1 + \omega^2(C_{-ox} + C_{sub})C_{sub}R_{sub}^2}{1 + \omega^2(C_{ox} + C_{sub})^2 R_{sub}^2} \quad (3)$$

The middle term of (1) denotes what is generally known as the substrate loss factor, which is a number less than unity that approaches one as parasitic $R_p$ dominates the second term in the denominator. Parasitic resistance $R_p$ is expanded as (2). From (2), decreasing $C_{ox}$ increases $R_p$. Increased $R_p$ raises the substrate loss factor closer to one, which improves Q factor.

The third term of (1) denotes what is generally known as the self-resonance factor, which is also a loss factor less than unity. Parasitic capacitance $C_p$ is expanded as (3). The self-resonance factor is increased if $C_p$ is decreased. From (3), $C_p$ is decreased when $C_{ox}$ is decreased.

$C_{ox}$ is generally obtained by:

$$C_{ox} = \frac{1}{2} lw \frac{\varepsilon_{ox}}{t_{ox}} \quad (4)$$

From (4), $C_{ox}$ is directly proportional to inductor area lw and oxide permittivity $\varepsilon_{ox}$, and inversely proportional to oxide thickness $t_{ox}$. Increased oxide thickness $t_{ox}$ decreases $C_{ox}$, which reduces the substrate loss factor and the self-resonance factor, thereby increasing the Q factor. "Oxide thickness" generally refers to thickness of oxide, or other suitable dielectric, between spiral inductor 100 and the substrate. Oxide thickness may be measured as distance between a surface of spiral inductor 100 proximal the substrate and the substrate itself. One measure of oxide thickness in accordance with various embodiments is shown in FIG. 4, labeled "$t_{ox}$."

Use of an extended (e.g., taller or deeper) upper conductive via effectively increases oxide thickness $t_{ox}$ by increasing distance between the inductor 100 and the substrate. To enhance inductor quality factor and overall device performance, in some embodiments, oxide thickness $t_{ox}$ is increased by extending an upper conductive via through at least two dielectric layers. In some embodiments, the oxide thickness is further increased by extending the upper conductive via through at least one etch stop layer positioned between the at least two dielectric layers.

Structure 210 and structure 220, each of which includes such an upper conductive via, are highlighted in FIG. 2. Positioning of via 213, an upper conductive via, among first metal line 211 and second metal line 212 of first coil segment 131 is shown in FIG. 2. FIG. 5n shows structure 210 in accordance with at least one embodiment. In some embodiments, first coil segment 131 includes at least ten, at least one hundred or more structures 210 distributed throughout first coil segment 131. Structure 220 is included in second coil segment 132. Structure 220 is highlighted to illustrate at a conceptual level positioning of via 223 among third metal line 221 and fourth metal line 222 of second coil segment 132. In some embodiments, second coil segment 132 includes at least ten, at least one hundred or more structures 220 distributed throughout second coil segment 132. In some embodiments, structures similar to structure 210 or structure 220 are included in first pad 142, first trace 141, third coil segment 133, fifth coil segment 135, second trace 143 and/or second pad 144.

In some embodiments, an array of structures 210 or structures 220 is distributed throughout spiral inductor 100, each structure 210 or structure 220 having width of about 0.1 micrometers to about 10 micrometers, length of about 0.1 micrometers to about 10 micrometers, and the array having pitch/spacing of about 0.1 micrometers to about 10 micrometers. Other embodiments may utilize greater or lesser length, width and/or array pitch/spacing. In some embodiments, structures 210 or structures 220 are distributed non-uniformly in one or more regions of spiral inductor 100 or inductor circuit 10.

Via 213 is an upper conductive via. Via 213 is in direct contact with first metal line 211 and in direct contact with second metal line 212. In some embodiments, via 213 is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method.

Via 223 is an upper conductive via. Via 223 is in direct contact with third metal line 221 and in direct contact with fourth metal line 222. In some embodiments, via 223 is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method.

Various embodiments of integrated circuit structures and process flows directed toward increasing oxide thickness with a view to reducing substrate loss factor and self-resonance factor to increase quality factor of an on-chip inductor are described below. In some embodiments, oxide thickness is increased by extending an upper conductive via through at least two dielectric layers to increase distance between the inductor 100 and the substrate. In some embodiments, the oxide thickness is further increased by extending the upper conductive via through at least one etch stop layer positioned between the at least two dielectric layers. Q factor for an on-chip inductor of 0.5 nano-Henries is greater than about 22 when using the structures and processes described herein.

FIG. 4 is a diagram of a conductive stack 40 in accordance with some embodiments. Stack 40 is depicted showing metal features 211, 212, 422, 432, 442, 452, 462, 472, 482, dielectric layers 400, 410, 415, 420, 425, 430, 435, 440, 445, 450, 455, 460, 465, 470, 475, 480, 485, substrate 240, and conductive vias 213, 421, 431, 441, 451, 461, 471, 481 from a bottom metal layer, through various intermediate metal layers, to a top metal layer. Seven intermediate metal layers are shown in FIG. 4. In some embodiments, fewer or more intermediate metal layers are utilized.

Seventeen dielectric layers are shown in FIG. 4. For clarity of illustration, intervening functional layers, including etch stop layers, anti-reflective layers, and the like, are not depicted in FIG. 4. In some embodiments, one or more functional layers are included between one or more of the dielectric layers. In some embodiments, dielectric layer 410 comprises at least dielectric layers 511, 512 and functional layers 501, 502, 503 shown in FIG. 5n. In some embodiments, dielectric layers 420, 430, 440, 450, 460, 470, 480 each have thickness less than thickness of dielectric layer 410. In some embodiments, dielectric layers 420, 430, 440, 450, 460, 470, 480 have thickness less than 7 kilo-Angstroms.

Conductive feature 482 is a bottom metal layer contact in dielectric layer 485. Via 481 is a bottom metal layer via in dielectric layer 480 and directly contacting conductive feature 482. Via 481 and dielectric layer 485 are on substrate 240. In some embodiments, no intervening metal layer exists between the surface of conductive feature 482 facing substrate 240 and substrate 240.

Conductive feature 472 is a first intermediate layer contact in dielectric layer 475. Conductive feature 472 is in direct contact with via 481. Conductive features 462, 452, 442, 432, 422 and second metal line 212 are second, third, fourth, fifth, sixth and seventh intermediate layer conductive features, respectively. In some embodiments, conductive features 432, 442, 452, 462, 472 have substantially the same thickness. In some embodiments, conductive feature 422 has substantially the same thickness as second metal line 212. In some embodiments, thickness of conductive features 432, 442, 452, 462, 472 is different from thickness of conductive feature 422 and second metal line 212. In some embodiments, conductive feature 422 and second metal line 212 are thicker than conductive features 432, 442, 452, 462, 472. Second metal line 212 and conductive features 422, 432, 442, 452, 462, 472, 482 are or comprise at least one conductive material. In some embodiments, the at least one conductive material is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method.

Via 471 is a first intermediate layer via in dielectric layer 470. Via 471 is in direct contact with conductive feature 472 and conductive feature 462. Via 461 is a second intermediate layer via in direct contact with conductive feature 462 and conductive feature 452. Via 451 is a third intermediate layer via in direct contact with conductive feature 452 and conductive feature 442. Via 441 is a fourth intermediate layer via in direct contact with conductive feature 442 and conductive feature 432. Via 431 is a fifth intermediate layer via in direct contact with conductive feature 432 and conductive feature 422. Via 421 is a sixth intermediate layer via in direct contact with conductive feature 422 and second metal line 212. In some embodiments, vias 421, 431 have substantially the same thickness. In some embodiments, vias 441, 451, 461, 471, 481 have substantially the same thickness. In some embodiments, thickness of vias 441, 451, 461, 471, 481 is different from thickness of vias 421, 431. In some embodiments, vias 421, 431 are thicker than vias 441, 451, 461, 471, 481.

Via 213 is an upper conductive via. Thickness of via 213 is labeled "t" in FIG. 4. Thickness of via 213 is greater than thickness of any intermediate conductive via between the surface of via 213 facing substrate 240 and substrate 240.

In some embodiments, thickness of via 213 is greater than about 8 kilo-Angstroms. In some embodiments, thickness of via 213 is in a range of about 8 kilo-Angstroms to about 30 kilo-Angstroms. Below 8 kilo-Angstroms, via 213 may not be thick enough to provide sufficient power-handling capability, and may also introduce excessive intermetal capacitance between first metal line 211 and second metal line 212. Formation of via 213 through a single oxide layer having thickness in excess of 30 kilo-Angstroms may adversely affect process uniformity when etching an opening for via 213 through the single oxide layer in which the via 213 is formed.

In some embodiments, via 213 is extended through at least two dielectric layers of dielectric layer 410 to further increase the oxide thickness by further increasing distance between the inductor 100 and the substrate. Use of two dielectric layers separated by an etch stop layer allows for a thicker via 213 while avoiding adverse effects on process uniformity by etching the two dielectric layers in two distinct etching operations. In some embodiments, thickness of via 213 extending through at least two dielectric layers is in a range of about 16 kilo-Angstroms to 60 kilo-Angstroms. In some embodiments, via 213 has thickness of about 48 kilo-Angstroms. Via 213 having thickness much greater than 8 kilo-Angstroms effectively increases $t_{ox}$, thereby reducing $C_{ox}$ and increasing quality factor. Further dielectric layers and etch stop layers may be introduced to further increase thickness of via 213. Via 213 having excessive thickness may introduce unwanted stress on the lower metal layers, which may lead to delamination.

Figure 5G:
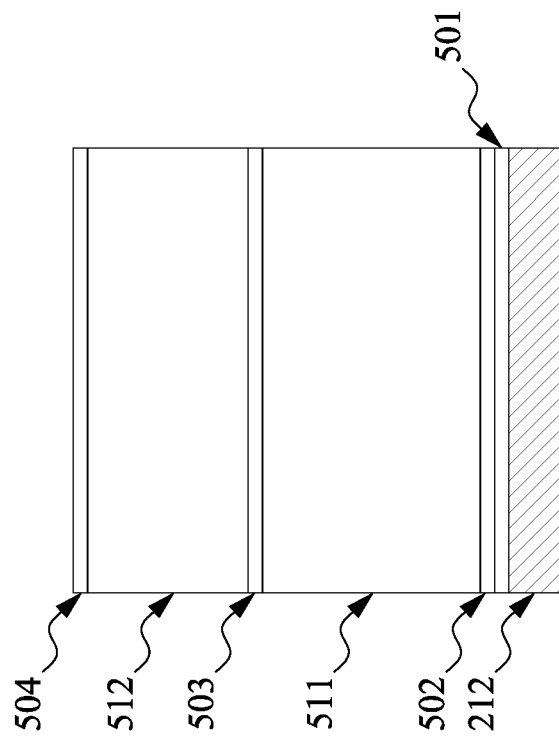
FIGS. 5a-5n are cross-sectional diagrams of a method of fabricating the structure of FIG. 4 in accordance with some embodiments.

FIG. 5a to FIG. 5n are diagrams showing intermediate semiconductor structures illustrating a method of fabricating structure 210 of FIG. 2 and FIG. 4 in accordance with some embodiments. FIG. 6 is a flow chart of the method of fabricating the structure 210 in accordance with some embodiments. FIG. 5a to FIG. 5j generally relate to formation of via 213. FIG. 5k to FIG. 5n generally relate to formation of first metal line 211.

In FIG. 5a, second metal line 212 is provided. In some embodiments, second metal line 212 is a contact or trace in an intermediate metal layer. In some embodiments, formation of second metal line 212 is achieved by at least defining a feature in a lithography process, removing dielectric material to form an opening substantially corresponding to the feature, depositing or plating a conductive material in and over the opening, and planarizing and/or polishing the conductive material and the dielectric layer. In some embodiments, the at least one conductive material is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method. In some embodiments, a barrier seed layer is formed in the opening prior to depositing or plating the conductive material in the opening.

FIG. 5b shows an intermediate semiconductor structure after performing operation 600 of the flowchart 60 shown in FIG. 6. In FIG. 5b, functional layer 501 is formed on second metal line 212. In some embodiments, functional layer 501 is a first functional layer. In some embodiments, functional layer 501 is a first etch stop layer. For example, as shown in FIG. 6, operation 600 may include forming functional layer 501 by deposition of a first etch stop layer (ESL1). Generally, an etch stop layer (ESL) provides a mechanism to stop an etch process when forming conductive features, such as contacts or vias. An ESL may be formed of a dielectric material having a different etch selectivity from adjacent layers or components. In some embodiments, functional layer 501 comprises or is silicon nitride, silicon carbon nitride, silicon carbon oxide, carbon nitride, silicon carbide, the like, or a combination thereof deposited by an appropriate deposition process. In some embodiments, thickness of functional layer 501 is in a range of about 300 Angstroms to 1000 Angstroms. In some embodiments, functional layer 501 is formed of silicon carbide and has thickness of about 750 Angstroms. It may be advantageous to use a thick functional layer 501 both to avoid forming voids in the functional layer 501 and to increase thickness of via 213 and oxide thickness $t_{ox}$. An excessively thick functional layer 501 may increase etching time and volume of etchant consumed to etch through functional layer 501.

FIG. 5c shows an intermediate semiconductor structure after performing operation 601 of FIG. 6. In FIG. 5c, functional layer 502 is formed on functional layer 501. In some embodiments, 502 is a second functional layer. In some embodiments, functional layer 502 is a second etch stop layer similar to the first etch stop layer. For example, as shown in FIG. 6, operation 601 may include forming functional layer 502 by deposition of a second etch stop layer (ESL2). In some embodiments, functional layer 502 comprises or is silicon nitride, silicon carbon nitride, silicon carbon oxide, carbon nitride, silicon carbide, the like, or a combination thereof deposited by an appropriate deposition process on functional layer 501. In some embodiments, thickness of functional layer 502 is in a range of about 300 Angstroms to 1000 Angstroms. In some embodiments, functional layer 502 is formed of the same material as functional layer 501. In some embodiments, functional layer 502 is formed of silicon carbide and has thickness of about 750 Angstroms. It may be advantageous to use a thick functional layer 502 both to avoid forming voids in the functional layer 502 and to increase thickness of via 213 and oxide thickness $t_{ox}$. An excessively thick functional layer 502 may increase etching time and volume of etchant consumed to etch through functional layer 502.

FIG. 5d shows an intermediate semiconductor structure after performing operation 602 of FIG. 6. In FIG. 5d, dielectric layer 511 is formed on functional layer 502. In some embodiments, dielectric layer 511 is a first dielectric layer. In some embodiments, dielectric layer 511 is formed of a dielectric material deposited, by an appropriate deposition process, on the functional layer 502. In some embodiments, the dielectric material may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof. For example, as shown in FIG. 6, operation 602 may include forming dielectric layer 511 by deposition of a first oxide layer (OX1). In some embodiments, thickness of dielectric layer 511 is in a range of about 4 kilo-Angstroms to about 30 kilo-Angstroms. In some embodiments, thickness of dielectric layer 511 is in a range of about 20 kilo-Angstroms to about 30 kilo-Angstroms. In some embodiments, dielectric layer 511 is formed of USG and has a thickness of about 25 kilo-Angstroms. A thicker dielectric layer 511 is advantageous to increase thickness of via 213 and oxide thickness $t_{ox}$. An excessively thick dielectric layer 511 will consume more time and material in production and may also adversely impact process uniformity.

FIG. 5e shows an intermediate semiconductor structure after performing operation 603 of FIG. 6. In FIG. 5e, functional layer 503 is formed on dielectric layer 511. In some embodiments, functional layer 503 is a third functional layer. In some embodiments, functional layer 503 is a third etch stop layer. For example, as shown in FIG. 6, operation 603 may include forming functional layer 503 by deposition of a third etch stop layer (ESL3). In some embodiments, functional layer 503 is formed of a dielectric material. In some embodiments, functional layer 503 comprises or is silicon nitride, silicon carbon nitride, silicon carbon oxide, carbon nitride, silicon carbide, the like, or a combination thereof deposited by an appropriate deposition process on dielectric layer 511. In some embodiments, thickness of functional layer 503 is in a range of about 200 Angstroms to 1000 Angstroms. In some embodiments, functional layer 503 is formed of a different material as the first and second etch stop layers. In some embodiments, functional layer 503 is formed of silicon nitride and has thickness of about 500 Angstroms. It may be advantageous to use a thick functional layer 503 both to avoid forming voids in the functional layer 503 and to increase thickness of via 213 and oxide thickness $t_{ox}$. An excessively thick functional layer 503 may increase etching time and volume of etchant consumed to etch through functional layer 503.

Figure 5F:
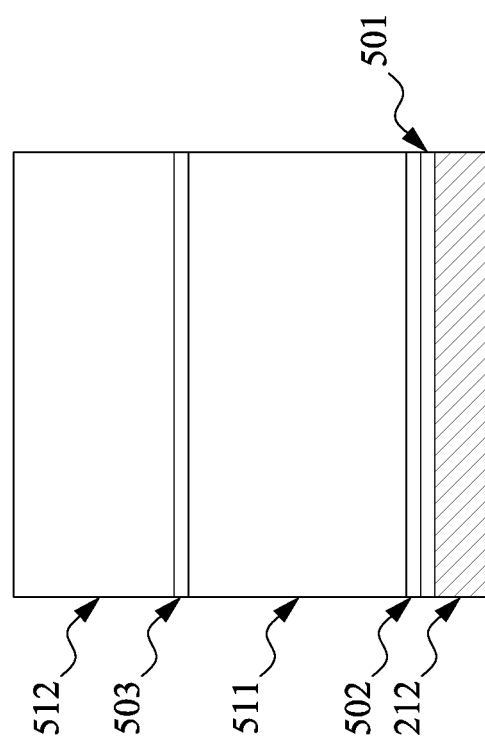
Figure 6:
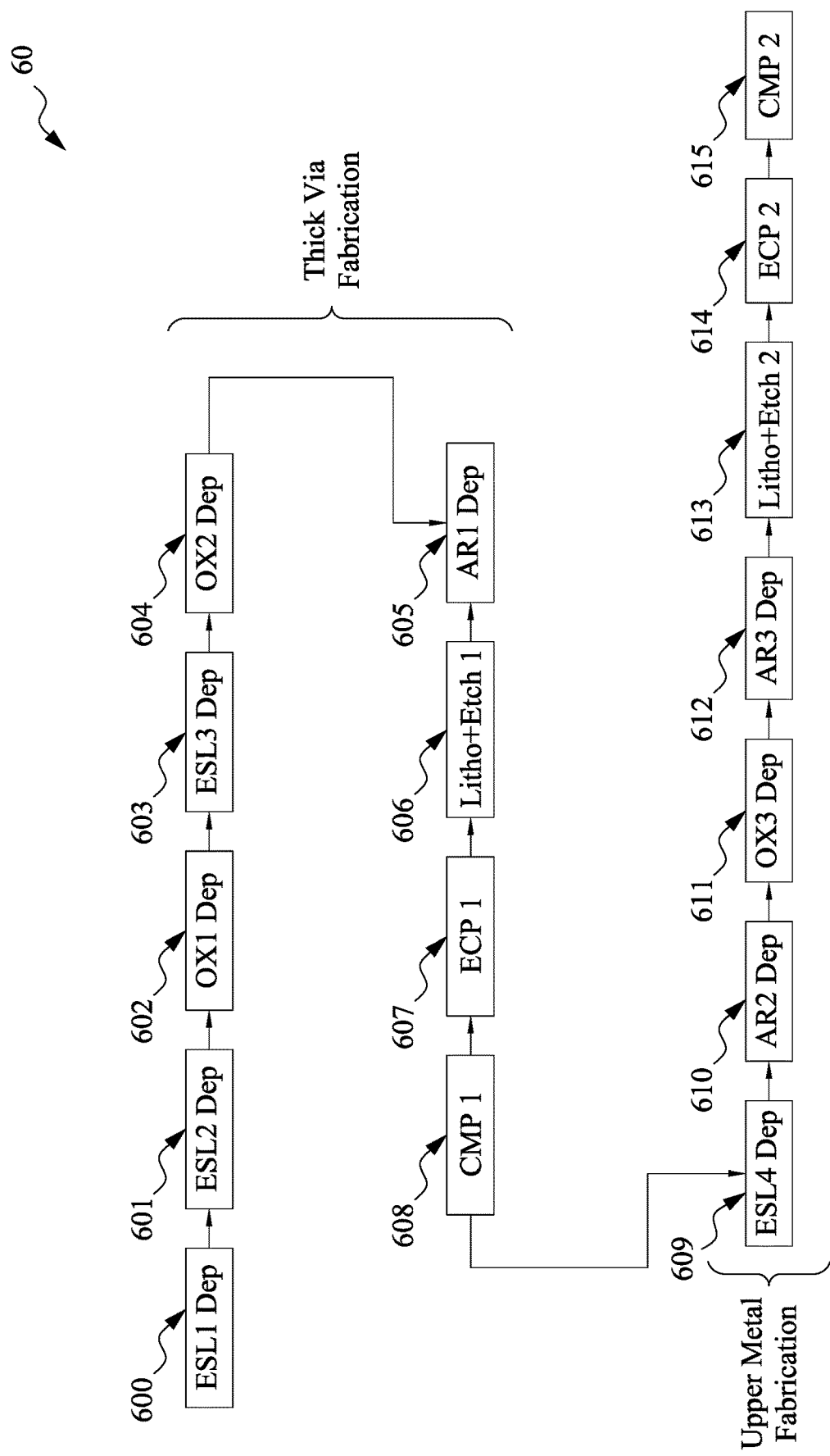
FIG. 6 is a flow chart of the method of fabricating the conductive portion in accordance with some embodiments.

FIG. 5f shows an intermediate semiconductor structure after performing operation 604 of FIG. 6. In FIG. 5f, dielectric layer 512 is formed on functional layer 503. In some embodiments, dielectric layer 512 is a second dielectric layer. In some embodiments, dielectric layer 512 is deposited, by an appropriate deposition process, on functional layer 503. In some embodiments, dielectric layer 512 is formed of a dielectric material. In some embodiments, dielectric layer 512 comprises or is silicon dioxide, a low-k dielectric material, silicon oxynitride, PSG, BSG, BPSG, USG, FSG, OSG, SiOxCy, Spin-On-Glass, Spin-On-Polymers, silicon carbon material, a compound thereof, a composite thereof, the like, or a combination thereof. For example, as shown in FIG. 6, operation 604 may include forming dielectric layer 512 by deposition of a second oxide layer (OX2). In some embodiments, thickness of dielectric layer 512 is in a range of about 4 kilo-Angstroms to about 30 kilo-Angstroms. In some embodiments, thickness of dielectric layer 512 is greater than about 5 kilo-Angstroms, greater than about 10 kilo-Angstroms, greater than about 20 kilo-Angstroms or greater than about 30 kilo-Angstroms. In some embodiments, the dielectric layer 512 is formed of a same material as the dielectric layer 511. In some embodiments, the dielectric layer 512 is formed of USG and has a thickness of about 26 kilo-Angstroms. In some embodiments, dielectric layer 512 is formed of USG and has a thickness of about 25 kilo-Angstroms. A thicker dielectric layer 512 is advantageous to increase thickness of via 213 and oxide thickness $t_{ox}$. An excessively thick dielectric layer 512 will consume more time and material in production and may also adversely impact process uniformity. The combination of dielectric layers 511, 512 and functional layer 503 allows for greater thickness of via 213, while splitting etching of the dielectric layers 511, 512 into two separate operations, which may improve uniformity and yield.

FIG. 5g shows an intermediate semiconductor structure after performing operation 605 of FIG. 6. In FIG. 5g, functional layer 504 is formed on dielectric layer 512. In some embodiments, functional layer 504 is a fourth functional layer. In some embodiments, functional layer 504 is a first anti-reflective layer. For example, as shown in FIG. 6, operation 605 may include forming functional layer 503 by deposition of a first anti-reflective layer (AR1). The first anti-reflective layer is used to mitigate reflections from underlying layers which are reflective to light used in a subsequent lithographic process. In some embodiments, functional layer 504 comprises or is silicon oxide, silicon oxycarbide, silicon oxynitride, hydrocarbon-containing silicon oxide, silicon nitride, titanium nitride, tantalum nitride, titanium containing material, tantalum containing material, an organic material, or any combination thereof. In some embodiments, functional layer 504 comprises or is a nitrogen-free material, such as a nitrogen-free oxide. In some embodiments, functional layer 504 comprises or is a nitrogen-free silicon oxycarbide. Functional layer 504 is deposited on dielectric layer 512 by any suitable technique, such as CVD, plasma-enhanced CVD (PECVD), high-density plasma CVD (HDP-CVD), spin-on coating process, or the like. In some embodiments, thickness of functional layer 504 is in a range of about 300 Angstroms to 1000 Angstroms. In some embodiments, functional layer 504 is formed of silicon oxynitride and has a thickness of about 600 Angstroms. Thickness of the functional layer 504 may be chosen to be thick enough to prevent voids to provide a uniform anti-reflective function, while also being thin enough to account for material and deposition cost of the layer, as well as etchant material and time cost for etching the layer, and slurry material and time cost for planarizing/removing the layer.

Figure 5I:
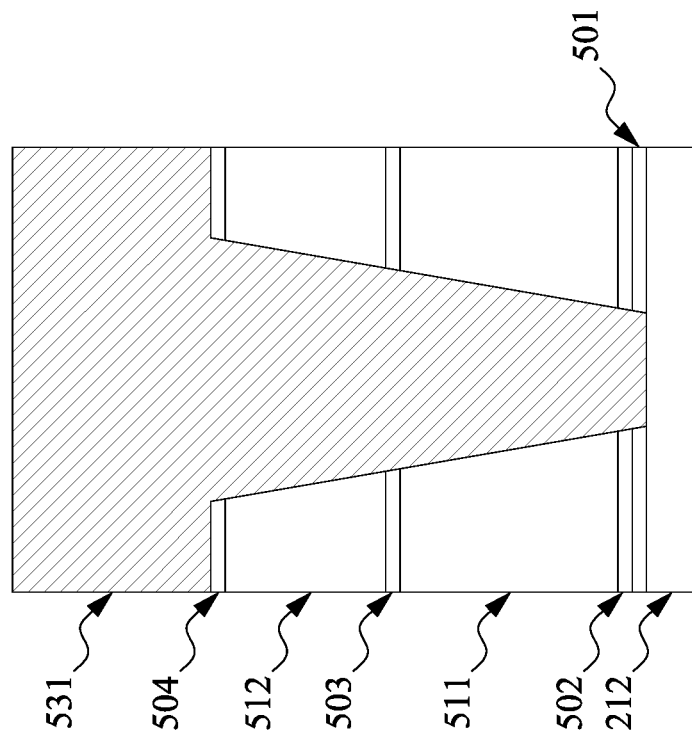
Figure 5H:
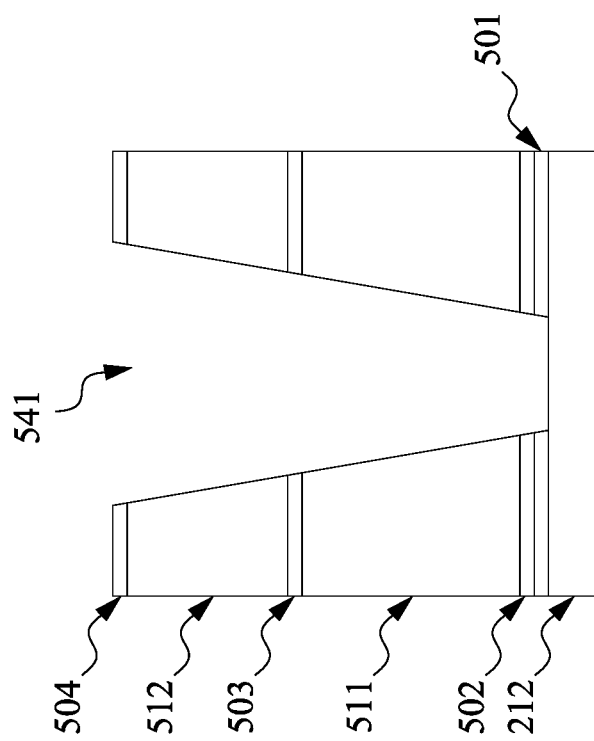

FIG. 5h shows an intermediate semiconductor structure formed after performing operation 606 of FIG. 6. At operation 606, opening 541 is formed. Opening 541 is formed through functional layer 504, dielectric layer 512, functional layer 503, dielectric layer 511, functional layer 502 and functional layer 501. Opening 541 can be formed using a patterned photoresist layer that defines an opening pattern followed by a suitable etching process. For example, as shown in FIG. 6, operation 606 may include forming opening 541 by at least one first lithography operation and at least one first etch operation (Litho+Etch 1). The patterned photoresist layer is then removed using any suitable stripping process. Opening 541 exposes a portion of the top surface of second metal line 212 to provide an electrical connection.

FIG. 5i shows an intermediate semiconductor structure after performing operation 607 of FIG. 6. In FIG. 5i, conductive plug 531 is formed in opening 541, and on functional layer 504. For example, as shown in FIG. 6, operation 607 may include forming conductive plug 531 by a first electroless copper plating process (ECP 1). Conductive plug 531 substantially fills the removed portions of functional layer 504, dielectric layer 512, functional layer 503, dielectric layer 511, functional layer 502 and functional layer 501 which comprise opening 541, and directly contacts second metal line 212. In some embodiments, conductive plug 531 is formed of at least one conductive material. In some embodiments, the at least one conductive material is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method. In some embodiments, conductive plug 531 is formed using a dual damascene process. In some embodiments, the plating process is an electroless copper plating (ECP) process. In some embodiments, the electroless copper plating process is preceded by forming a seed layer on sidewalls of the removed portions. In some embodiments, the seed layer is a barrier seed layer.

Figure 5K:
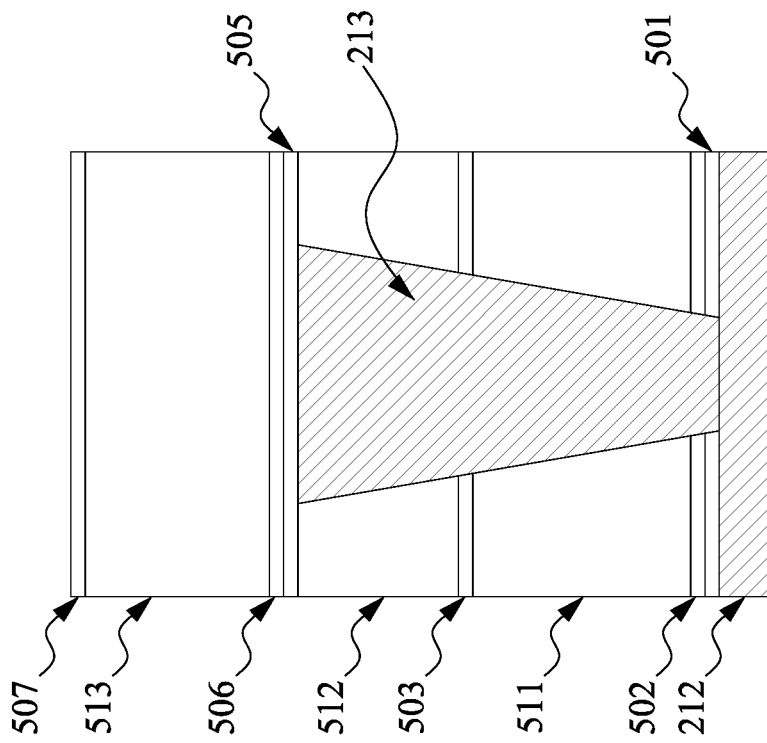
Figure 5J:
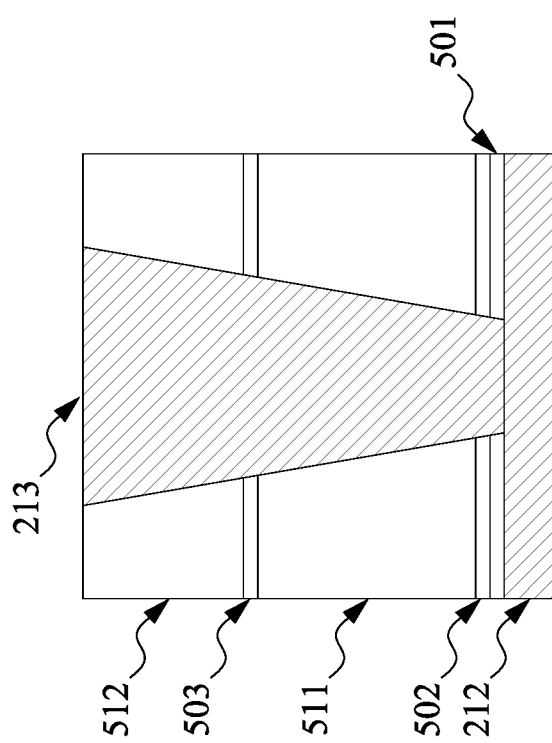

FIG. 5j shows an intermediate semiconductor structure after performing operation 608 of FIG. 6. In FIG. 5j, conductive plug 531 is planarized and/or polished to form first metal line 211. For example, as shown in FIG. 6, operation 608 may include polishing and/or planarizing conductive plug 531 by a first chemical mechanical polishing process (CMP 1). In some embodiments, after conductive plug 531 is formed and filled in the opening 541, a chemical mechanical polishing (CMP) operation removes any excess material of conductive plug 531, and any remaining mask, such as functional layer 504 to have a top surface of conductive plug 531 substantially coplanar with a top surface of dielectric layer 512, as shown in FIG. 5j. In some embodiments, thickness of dielectric layer 512 is reduced after performing operation 608 by about 20%. The thickness of the dielectric layer 512 may be reduced by less than about 20% if sufficient planarity may be achieved while polishing away less material of the dielectric layer 512.

FIG. 5k shows an intermediate semiconductor structure after performing operation 609, operation 610, operation 611 and operation 612 of FIG. 6. Operation 609 includes forming functional layer 505. In some embodiments, functional layer 505 is a fifth functional layer. In some embodiments, functional layer 505 is an etch stop layer. For example, as shown in FIG. 6, operation 609 may include forming functional layer 505 by deposition of a fourth etch stop layer (ESL4). In some embodiments, functional layer 505 is formed of a dielectric material. In some embodiments, functional layer 505 comprises or is silicon nitride, silicon carbon nitride, silicon carbon oxide, carbon nitride, silicon carbide, the like, or a combination thereof deposited by an appropriate deposition process on functional layer 512 and conductive via 213. In some embodiments, thickness of functional layer 505 is in a range of about 200 Angstroms to 1000 Angstroms. In some embodiments, functional layer 505 is formed of a different material as the first and second etch stop layers. In some embodiments, functional layer 505 is formed of silicon nitride and has thickness of about 500 Angstroms. It may be advantageous to use a thick functional layer 505 both to avoid forming voids in the functional layer 505. An excessively thick functional layer 505 may increase etching time and volume of etchant consumed to etch through functional layer 505.

Operation 610 of the flowchart 60 of FIG. 6 includes forming functional layer 506. In some embodiments, functional layer 506 is a sixth functional layer. In some embodiments, functional layer 506 is an anti-reflective layer deposited on functional layer 505. For example, as shown in FIG. 6, operation 610 may include forming functional layer 506 by deposition of a second anti-reflective layer (AR2). In some embodiments, functional layer 506 is formed of a dielectric material. In some embodiments, functional layer 506 comprises or is silicon oxide, silicon oxycarbide, silicon oxynitride, hydrocarbon-containing silicon oxide, silicon nitride, titanium nitride, tantalum nitride, titanium containing material, tantalum containing material, an organic material, or any combination thereof. In some embodiments, functional layer 506 comprises or is a nitrogen-free material, such as a nitrogen-free oxide. In some embodiments, functional layer 506 comprises or is a nitrogen-free silicon oxycarbide. Functional layer 506 is deposited on functional layer 505 by any suitable technique, such as CVD, plasma-enhanced CVD (PECVD), high-density plasma CVD (HDP-CVD), spin-on coating process, or the like. In some embodiments, thickness of functional layer 506 is in a range of about 200 Angstroms to 1000 Angstroms. In some embodiments, functional layer 506 is formed of silicon oxynitride, and has thickness of about 600 Angstroms. Thickness of the functional layer 506 may be chosen to be thick enough to prevent voids to provide a uniform anti-reflective function, while also being thin enough to account for material and deposition cost of the layer, as well as etchant material and time cost for etching the layer, and slurry material and time cost for planarizing/removing the layer.

Operation 611 includes forming dielectric layer 513. In some embodiments, dielectric layer 513 is a third dielectric layer deposited on functional layer 506. In some embodiments, dielectric layer 513 comprises or is silicon dioxide, a low-k dielectric material, silicon oxynitride, PSG, BSG, BPSG, USG, FSG, OSG, SiOxCy, Spin-On-Glass, Spin-On-Polymers, silicon carbon material, a compound thereof, a composite thereof, the like, or a combination thereof. For example, as shown in FIG. 6, operation 611 may include forming dielectric layer 513 by deposition of a third oxide layer (OX3). In some embodiments, thickness of dielectric layer 513 is in a range of about 4 kilo-Angstroms to about 30 kilo-Angstroms. In some embodiments, thickness of dielectric layer 513 is greater than about 5 kilo-Angstroms, greater than about 10 kilo-Angstroms, greater than about 20 kilo-Angstroms, greater than about 30 kilo-Angstroms or greater than about 40 kilo-Angstroms. In some embodiments, dielectric layer 513 is formed of USG, and has thickness of about 38 kilo-Angstroms. Thickness of dielectric layer 513 may be similar to or slightly greater than desired thickness of the top metal layer. Excessive thickness of dielectric layer 513 will increase planarization time and consumed materials, e.g. slurry, to achieve the desired thickness of the top metal layer. An excessively thick top metal layer may cause unwanted stress that may lead to delamination in the intermediate or bottom metal layer/layers.

Operation 612 includes forming functional layer 507. In some embodiments, functional layer 507 is a seventh functional layer deposited on dielectric layer 513. In some embodiments, functional layer 507 is an anti-reflective layer. For example, as shown in FIG. 6, operation 612 may include forming functional layer 507 by deposition of a third anti-reflective layer (AR3). In some embodiments, functional layer 507 comprises or is silicon oxide, silicon oxycarbide, silicon oxynitride, hydrocarbon-containing silicon oxide, silicon nitride, titanium nitride, tantalum nitride, titanium containing material, tantalum containing material, an organic material, or any combination thereof. In some embodiments, functional layer 507 comprises or is a nitrogen-free material, such as a nitrogen-free oxide. In some embodiments, functional layer 507 comprises or is a nitrogen-free silicon oxycarbide. Functional layer 507 is deposited on functional layer 507 by any suitable technique, such as CVD, plasma-enhanced CVD (PECVD), high-density plasma CVD (HDP-CVD), spin-on coating process, or the like. In some embodiments, thickness of functional layer 507 is in a range of about 200 Angstroms to 1000 Angstroms. Thickness of the functional layer 507 may be chosen to be thick enough to prevent voids to provide a uniform anti-reflective function, while also being thin enough to account for material and deposition cost of the layer, as well as etchant material and time cost for etching the layer, and slurry material and time cost for planarizing/removing the layer.

Figure 5M:
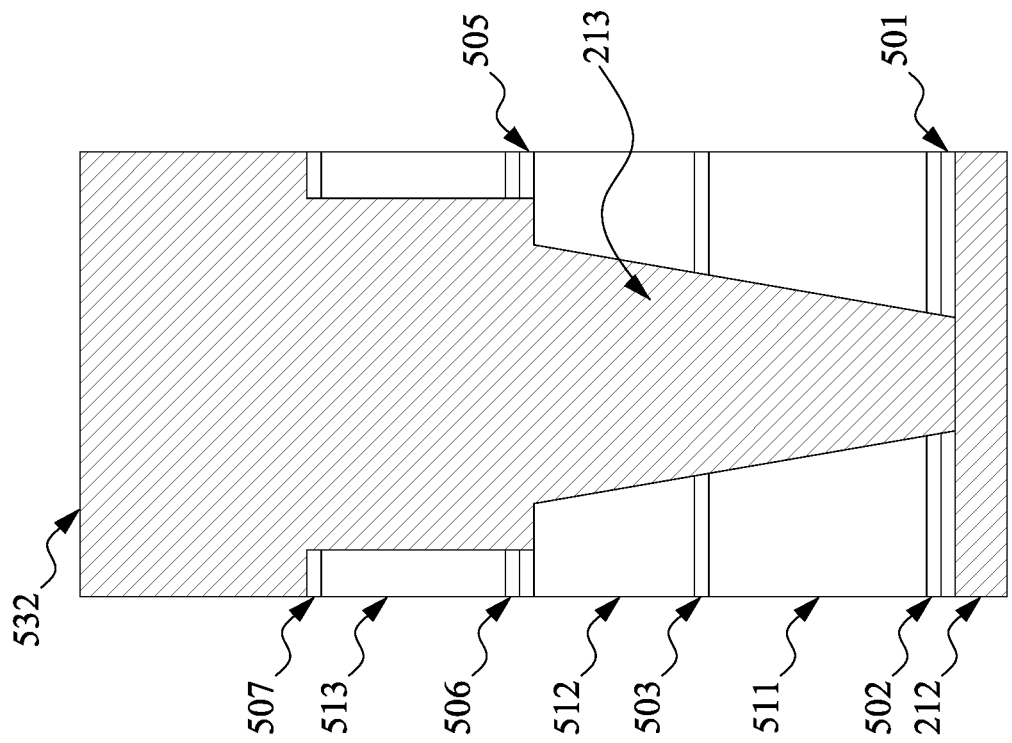
Figure 5L:
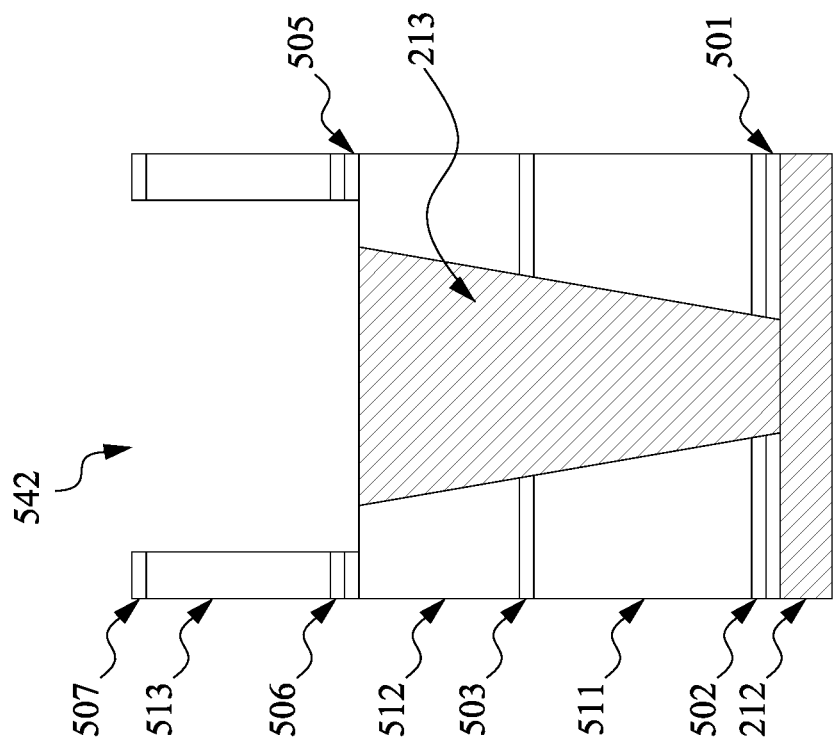

FIG. 5l shows an intermediate semiconductor structure after performing operation 613 of FIG. 6. At operation 613, opening 542 is formed. Opening 542 is formed through functional layer 507, dielectric layer 513, functional layer 506, and functional layer 505. Opening 542 can be formed using a patterned photoresist layer that defines an opening pattern followed by a suitable etching process. For example, as shown in FIG. 6, operation 613 may include forming opening 542 by at least one second lithography operation and at least one second etch operation (Litho+Etch 2). The patterned photoresist layer is then removed using any suitable stripping process. Opening 542 exposes a portion of the top surface of conductive via 213 to provide an electrical connection.

FIG. 5m shows an intermediate semiconductor structure after performing operation 614 of FIG. 6. In FIG. 5m, conductive plug 532 is formed in opening 542, and on functional layer 507. For example, as shown in FIG. 6, operation 614 may include forming conductive plug 532 by a second electroless copper plating process (ECP 2). Conductive plug 532 substantially fills the removed portions of functional layer 507, dielectric layer 513, functional layer 506 and functional layer 505 which comprise opening 542, and directly contacts conductive via 213. In some embodiments, conductive plug 532 is formed of at least one conductive material. In some embodiments, the at least one conductive material is or comprises a metal, such as tungsten, copper, aluminum, gold, silver, alloys thereof, the like, or a combination thereof, and may be deposited by chemical vapor deposition (CVD), atomic layer deposition (ALD), physical vapor deposition (PVD), electroplating, electroless plating, or other suitable method. In some embodiments, conductive plug 532 is formed using a dual damascene process. In some embodiments, the plating process is an electroless copper plating (ECP) process. In some embodiments, the electroless copper plating process is preceded by forming a seed layer on sidewalls of the removed portions. In some embodiments, the seed layer is a barrier seed layer.

FIG. 5n shows structure 210 after performing operation 615 of FIG. 6. In FIG. 5n, conductive plug 532 is planarized and/or polished to form first metal line 211. For example, as shown in FIG. 6, operation 615 may include polishing and/or planarizing conductive plug 532 by a second chemical mechanical polishing process (CMP 2). In some embodiments, after conductive plug 532 is formed and filled in opening 542, a chemical mechanical polish (CMP) removes any excess material of conductive plug 532, and any remaining mask, such as functional layer 507 to have a top surface of conductive plug 532 substantially coplanar with a top surface of dielectric layer 513, as shown in FIG. 5n. In some embodiments, thickness of dielectric layer 513 is reduced after performing operation 615.

FIG. 6 is explained above with reference to FIG. 5a to FIG. 5n. In some embodiments, the flowchart 60 includes more or fewer processes than depicted in FIG. 6. In some embodiments, forming functional layer 502, which corresponds to operation 601 is omitted. In some embodiments, operation 614 includes at least two electroless copper plating operations. In some embodiments, a baking operation is performed after operation 613 and prior to operation 614 and/or after operation 614 and prior to operation 615. Other embodiments may include further functional layer deposition operations and/or baking.

Figure 7:
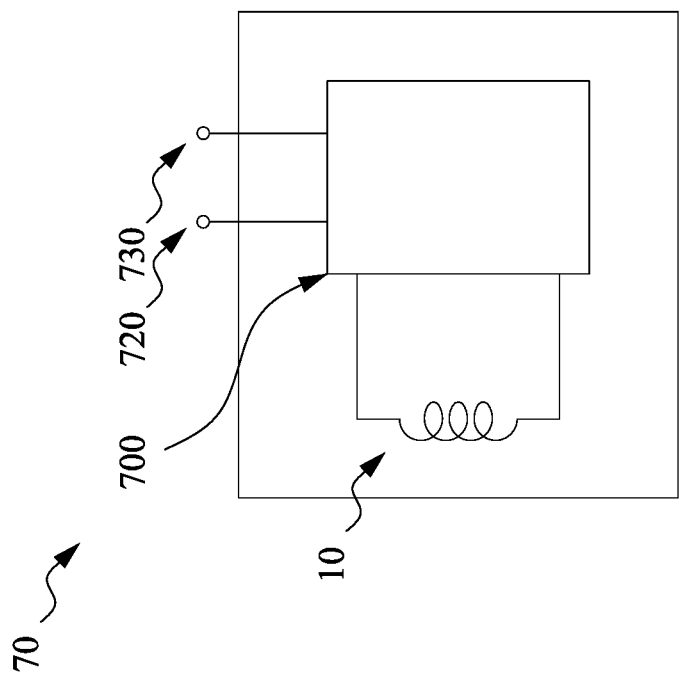
FIG. 7 is a circuit block diagram of a passive radio frequency device in accordance with some embodiments.

FIG. 7 is a circuit block diagram of passive radio frequency device 70 in accordance with some embodiments. In some embodiments, the passive radio frequency device 70 is a radio frequency identification (RFID) transceiver of an RFID tag. Any RFID tag having no internal power supply is considered "passive." Passive RFID tags harvest power from received radio frequency signals, typically from an RFID reader device, and reuse the harvested power to transmit a response to the RFID reader device.

The passive radio frequency device 70 may include terminal 720 for receiving radio frequency signals. In some embodiments, terminal 720 is electrically connected to or otherwise includes an antenna.

Terminal 730 of passive radio frequency device 70 is an output terminal for emitting radio frequency signals. In some embodiments, terminal 730 includes an antenna. In some embodiments, terminal 730 and terminal 720 include the same antenna.

Circuitry 700 of passive radio frequency device 70 is electrically connected to terminal 720 and terminal 730. In some embodiments, circuitry 700 includes one or more of a modulator, a demodulator, power recovery/harvesting circuitry, a clock, control circuitry, processing circuitry, coding circuitry, decoding circuitry, or memory.

Passive radio frequency device 70 includes inductor circuit 10. In some embodiments, inductor circuit 10 is used to receive the radio frequency signals. Inductor circuit 10 is electrically connected to circuitry 700. Inductor circuit 10 includes at least via 213 in dielectric layer 513, and first metal line 211 substantially directly contacting via 213 and extended through dielectric layer 511, dielectric layer 512, and functional layer 503. Inductor circuit 10 has enhanced quality factor due to reduced $C_{ox}$ by increased upper conductive via thickness, as described above with respect to at least FIG. 3. Passive radio frequency device 70 including inductor circuit 10 has improved sensitivity when receiving the radio frequency signals, and also improved ability to reject unwanted radio frequency signals.

Figure 8:
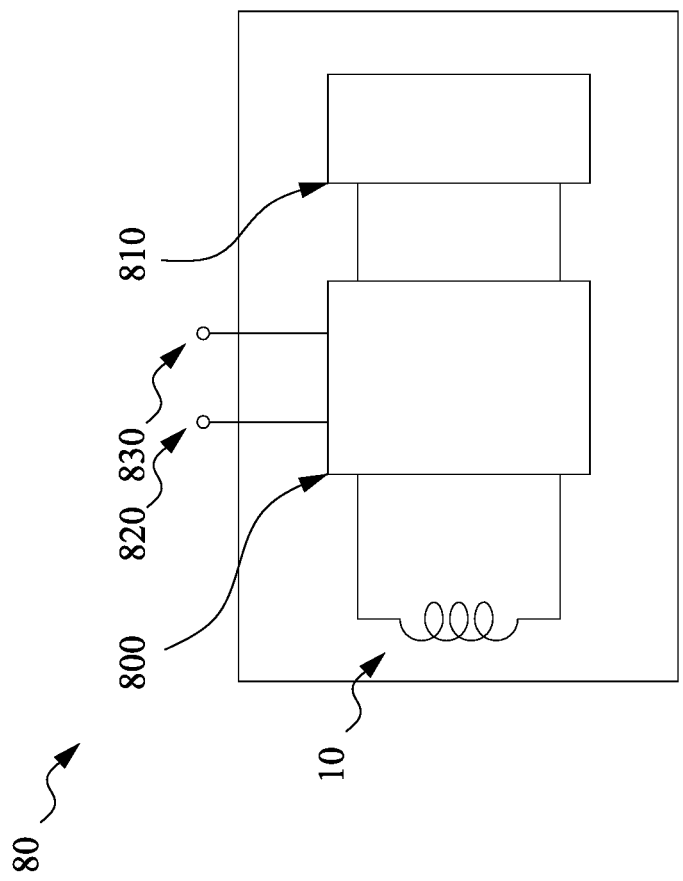
FIG. 8 is a circuit block diagram of an active radio frequency device in accordance with some embodiments.

FIG. 8 is a circuit block diagram of active radio frequency device 80 in accordance with some embodiments. In some embodiments, active radio frequency device 80 is a radio frequency identification (RFID) transceiver of an RFID tag. Any RFID tag having an internal power supply is considered "active." Active RFID tags generally do not need to harvest power from received radio frequency signals, typically from an RFID reader device, and use power from the internal power supply to transmit a response to the RFID reader device. As such, while active radio frequency device 80 may include many similar electronic components to passive radio frequency device 70, configuration of the electronic components in active radio frequency device 80 may differ significantly from the configuration in passive radio frequency device 70. As such, different reference numerals are used throughout FIG. 8.

Terminal 820 of active radio frequency device 80 is an input terminal for receiving radio frequency signals. In some embodiments, terminal 820 includes an antenna.

Terminal 830 of active radio frequency device 80 is an output terminal for emitting radio frequency signals. In some embodiments, terminal 830 includes an antenna. In some embodiments, terminal 830 and terminal 820 include the same antenna.

Circuitry 800 of active radio frequency device 80 is electrically connected to terminal 820 and terminal 830. In some embodiments, circuitry 800 includes one or more of a modulator, a demodulator, a clock, control circuitry, processing circuitry, coding circuitry, decoding circuitry, or memory.

Power source 810 of active radio frequency device 80 is electrically connected to circuitry 800. Power source 810 provides power to circuitry 800. In some embodiments, power source 810 includes at least a battery. In some embodiments, power source 810 includes power management circuitry.

Active radio frequency device 80 includes inductor circuit 10. In some embodiments, inductor circuit 10 is used to receive the radio frequency signals. Inductor circuit 10 is electrically connected to circuitry 800. Inductor circuit 10 includes at least via 213 in dielectric layer 513, and first metal line 211 substantially directly contacting via 213 and extended through dielectric layer 511, dielectric layer 512, and functional layer 503. Inductor circuit 10 has enhanced quality factor due to reduced $C_{ox}$, by increased upper conductive via thickness, as described above with respect to at least FIG. 3. Active radio frequency device 80 including inductor circuit 10 has improved sensitivity when receiving the radio frequency signals, and also improved ability to reject unwanted radio frequency signals.

Figure 9:
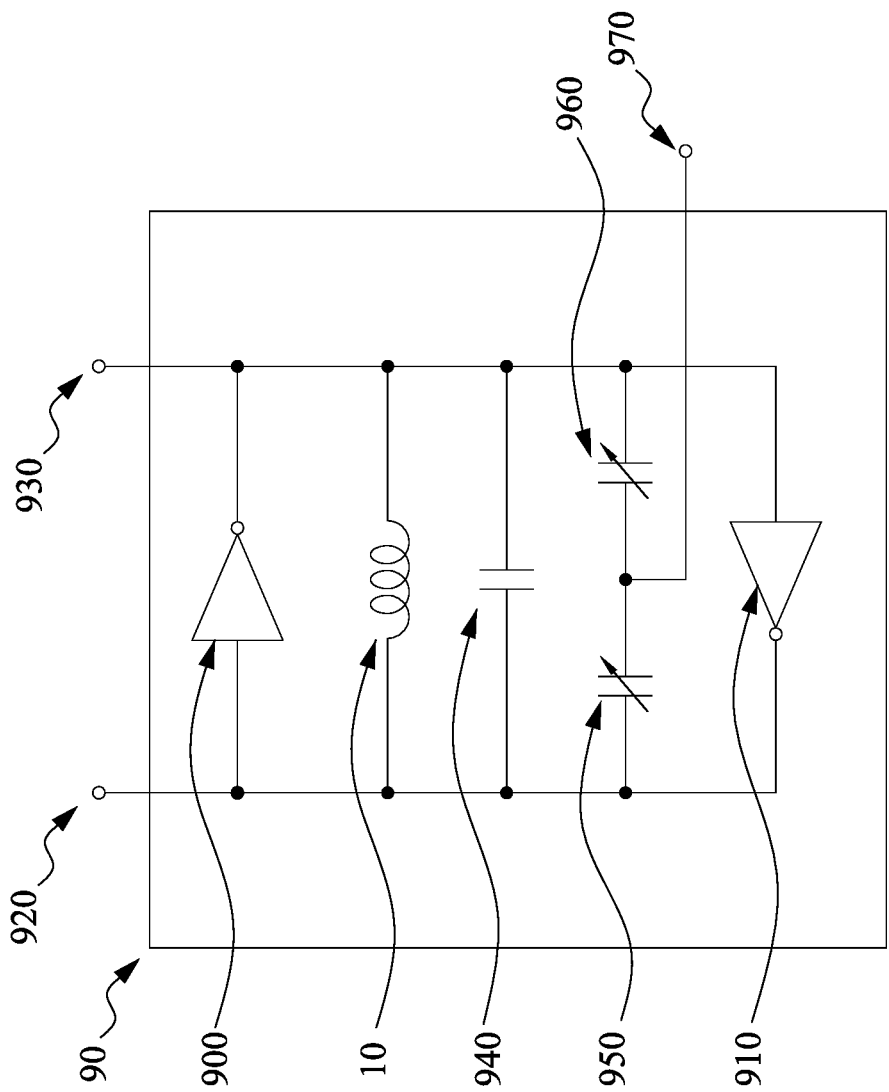
FIG. 9 is a circuit block diagram of a voltage controlled oscillator device in accordance with some embodiments.

FIG. 9 is a circuit block diagram of voltage controlled oscillator device 90 in accordance with some embodiments. Voltage controlled oscillator device 90 outputs a first clock at terminal 920 and a second clock at terminal 930 substantially the inverse of the first clock, both at a frequency controlled by a control voltage at terminal 970. Voltage controlled oscillator device 90 of FIG. 9 illustrates a voltage controlled oscillator including inductor circuit 10. In some embodiments, inductor circuit 10 is utilized as an on-chip inductor in a voltage controlled oscillator device utilizing a different architecture than that shown in FIG. 9.

Inverter 900 of voltage controlled oscillator device 90 outputs a first output signal at terminal 930 that is substantially the inverse of the first clock at terminal 920. An input terminal of inverter 900 for receiving the first clock is electrically connected to an output terminal of inverter 910, a first terminal of inductor circuit 10, a first terminal of capacitor 940, and a first terminal of variable capacitor 950. An output terminal of inverter 900 for outputting the second clock is electrically connected to an input terminal of inverter 910, a second terminal of inductor circuit 10, a second terminal of capacitor 940, and a first terminal of variable capacitor 960.

Inverter 910 of voltage controlled oscillator device 90 outputs the first clock at terminal 920 that is substantially the inverse of the second clock at terminal 930. An input terminal of inverter 910 for receiving the second clock is electrically connected to an output terminal of inverter 900, the second terminal of inductor circuit 10, the second terminal of capacitor 940, and the first terminal of variable capacitor 960. An output terminal of inverter 910 for outputting the first clock is electrically connected to the input terminal of inverter 900, the first terminal of inductor circuit 10, the first terminal of capacitor 940, and the first terminal of variable capacitor 950.

Inductor circuit 10, capacitor 940, variable capacitor 950 and variable capacitor 960 form a variable LC tank circuit that is tuned by the control voltage at terminal 970. The first terminal of inductor circuit 10 is electrically connected to the input terminal of inverter 900, the output terminal of inverter 910, the first terminal of capacitor 940, and the first terminal of variable capacitor 950. The second terminal of inductor circuit 10 is electrically connected to the output terminal of inverter 900, the input terminal of inverter 910, the second terminal of capacitor 940, and the first terminal of variable capacitor 960.

Inductor circuit 10 includes at least via 213 in dielectric layer 513, and first metal line 211 substantially directly contacting via 213 and extended through dielectric layer 511, dielectric layer 512, and functional layer 503. Inductor circuit 10 has enhanced quality factor due to reduced $C_{ox}$ by increased upper conductive via thickness, as described above with respect to at least FIG. 3. Voltage controlled oscillator device 90 has improved phase noise due to the enhanced quality factor.

Capacitor 940 of the LC tank circuit is a fixed capacitor. In some embodiments, capacitor 940 is a metal-oxide-metal (MOM) capacitor, a metal-insulator-metal (MIM) capacitor, or the like. The first terminal of capacitor 940 is electrically connected to the input terminal of inverter 900, the first terminal of inductor circuit 10, the first terminal of variable capacitor 950, and the output terminal of inverter 910. The second terminal of capacitor 940 is electrically connected to the output terminal of inverter 900, the second terminal of inductor circuit 10, the first terminal of variable capacitor 960 and the input terminal of inverter 910.

Variable capacitor 950 of the LC tank circuit is a variable capacitor. In some embodiments, variable capacitor 950 is a metal-oxide-semiconductor (MOS) capacitor. The first terminal of variable capacitor 950 is electrically connected to the input terminal of inverter 900, the first terminal of inductor circuit 10, the first terminal of capacitor 940, and the output terminal of inverter 910. A second terminal of variable capacitor 950 is electrically connected to a second terminal of variable capacitor 960 and terminal 970.

Variable capacitor 960 of the LC tank circuit is a variable capacitor. In some embodiments, variable capacitor 960 is a metal-oxide-semiconductor (MOS) capacitor. The first terminal of variable capacitor 960 is electrically connected to the output terminal of inverter 900, the second terminal of inductor circuit 10, the second terminal of capacitor 940, and the input terminal of inverter 910. The second terminal of variable capacitor 960 is electrically connected to the second terminal of variable capacitor 950 and terminal 970.

In addition, an integrated circuit device may include active devices located in or on the substrate 240 and interconnects directly or indirectly coupling at least one of the active device or the inductor 100. A complementary metal-oxide-semiconductor (CMOS) device, and other active and/or passive devices may be included in an integrated circuit device and/or coupled directly or indirectly to the inductor 100. The inductor 100 may be advantageous in high frequency applications of the integrated circuit device. Moreover, implementation of the inductor 100 into existing fabrication processes may be simple and cost effective. For example, fabrication of the inductor 100 may be achieved by employing existing fabrication techniques as future-developed techniques may also be employed. In addition, one or more of the via 213 or the first metal line 211 may be formed simultaneously with other existing metallization layers, such that incorporation of the inductor 100 into existing designs may not require additional process steps.

Various embodiments of integrated circuit structures and process flows directed toward increasing oxide thickness $t_{ox}$ with a view to reducing substrate loss factor and self-resonance factor to increase quality factor of on-chip inductors are described. Further embodiments of devices, including both passive and active radio frequency identification (RFID) transceivers and a voltage controlled oscillator (VCO), are also described. To enhance inductor quality factor and overall device performance, in some embodiments, oxide thickness $t_{ox}$ is increased by extending an upper conductive via through at least two dielectric layers. In some embodiments, the oxide thickness is further increased by extending the upper conductive via through at least one etch stop layer positioned between the at least two dielectric layers. Q factor for a 0.5 nano-Henry on-chip inductor is greater than about 22 when using the structures and processes described herein. Sensitivity of the RFID transceivers or phase noise of the VCO is improved due to the excellent quality factor of the inductor.

An embodiment of a device comprises a substrate, a first conductive layer, a first conductive via, a plurality of second conductive layer, and a plurality of second conductive vias. The first conductive layer is on the substrate. The first conductive via is between the first conductive layer and the substrate, and is electrically connected to the first conductive layer. The first conductive via has thickness greater than about 8 kilo-Angstroms. The plurality of second conductive layers is between the first conductive via and the substrate. The plurality of second conductive vias is between the first conductive via and the substrate.

An embodiment of a method includes forming a first dielectric layer on a first conductive layer. A second dielectric layer is formed on the first dielectric layer. A conductive via extending through the first dielectric layer and the second dielectric layer is formed. A third dielectric layer is formed on the second dielectric layer. At least a first conductive portion of an inductor is formed in the third dielectric layer and in direct contact with the conductive via.

Another embodiment of a device includes a first dielectric layer, a second dielectric layer, a first etch stop layer, a third dielectric layer, and an inductor. The second dielectric layer is on the first dielectric layer. The first etch stop layer is between the first dielectric layer and the second dielectric layer. The third dielectric layer is on the second dielectric layer. The inductor includes a conductive trace in the third dielectric layer, and a conductive via substantially directly contacting the conductive trace and extended through the first dielectric layer, the second dielectric layer, and the first etch stop layer. Circuitry is electrically coupled to the inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first conductive layer on the substrate;
a second conductive layer between the first conductive layer and the substrate;
a first conductive via in contact with the first conductive layer and the second conductive layer;
a plurality of third conductive layers between the second conductive layer and the substrate; and
a dielectric layer between the first conductive layer and the second conductive layer, the first conductive via extending completely through the dielectric layer, the dielectric layer including:
a first functional layer on and in contact with the second conductive layer, the first functional layer being a different material than the second conductive layer;
a second functional layer on and in contact with the first functional layer;
a first oxide layer on and in contact with the second functional layer, the first oxide layer being a different material than the second functional layer;
an etch stop layer on and in contact with the first oxide layer, the etch stop layer being a different material than the first oxide layer; and
a second oxide layer on the etch stop layer, the second oxide layer being in contact with the etch stop layer and the first conductive layer, the second oxide layer being a different material than the etch stop layer.

2. The device of claim 1, further comprising an inductor at least partially disposed in the first conductive layer and including the first conductive via.

3. The device of claim 1, further comprising a second dielectric layer on the dielectric layer, the first conductive layer being positioned in the second dielectric layer.

4. The device of claim 3, further comprising an anti-reflective layer between the second dielectric layer and the second oxide layer.

5. The device of claim 4, further comprising a second etch stop layer between the anti-reflective layer and the second oxide layer.

6. The device of claim 1, wherein the first conductive via has thickness in a range of about 16 kilo-Angstroms to about 60 kilo-Angstroms.

7. A device, comprising:
a first conductive layer;
a plurality of third conductive layers;
a second conductive layer between the first conductive layer and the plurality of third conductive layers;
a first conductive via in contact with the first conductive layer and the second conductive layer; and
a dielectric structure between the first conductive layer and the second conductive layer, the first conductive via extending completely through the dielectric structure, the dielectric structure including:
a first functional layer on and in contact with the second conductive layer, the first functional layer being a different material than the second conductive layer;
a second functional layer on and in contact with the first functional layer;
a first dielectric layer on and in contact with the second functional layer, the first dielectric layer being a different material than the second functional layer;
an etch stop layer on and in contact with the first dielectric layer, the etch stop layer being a different material than the first dielectric layer; and
a second dielectric layer on the etch stop layer, the second dielectric layer being in contact with the etch stop layer and the first conductive layer, the second dielectric layer being a different material than the etch stop layer.

8. The device of claim 7, further comprising an inductor at least partially disposed in the first conductive layer and including the first conductive via.

9. The device of claim 7, further comprising a third dielectric layer on the second dielectric layer, the first conductive layer being positioned in the third dielectric layer.

10. The device of claim 9, further comprising an anti-reflective layer between the third dielectric layer and the second dielectric layer.

11. The device of claim 10, further comprising a second etch stop layer between the anti-reflective layer and the second dielectric layer.

12. The device of claim 7, wherein the first conductive via has thickness in a range of about 16 kilo-Angstroms to about 60 kilo-Angstroms.

13. The device of claim 7, wherein the first and second dielectric layers are oxide layers.

14. A device, comprising:
a first conductive layer;
a plurality of third conductive layers;
a second conductive layer between the first conductive layer and the plurality of third conductive layers;
a first conductive via in contact with the first conductive layer and the second conductive layer; and
a dielectric structure between the first conductive layer and the second conductive layer, the first conductive via extending completely through the dielectric structure, the dielectric structure including:
a first functional layer on and in contact with the second conductive layer, the first functional layer being a different material than the second conductive layer;
a second functional layer on the first functional layer;
a first dielectric layer on the second functional layer, the first dielectric layer being a different material than the second functional layer;
an etch stop layer on the first dielectric layer, the etch stop layer being a different material than the first dielectric layer; and
a second dielectric layer on the etch stop layer, the second dielectric layer being in contact with the first conductive layer, the second dielectric layer being a different material than the etch stop layer, the first and second dielectric layers each having thickness at least about 50 times that of the etch stop layer.

15. The device of claim 14, further comprising an inductor at least partially disposed in the first conductive layer and including the first conductive via.

16. The device of claim 14, further comprising a third dielectric layer on the second dielectric layer, the first conductive layer being positioned in the third dielectric layer.

17. The device of claim 16, further comprising an anti-reflective layer between the third dielectric layer and the second dielectric layer.

18. The device of claim 17, further comprising a second etch stop layer between the anti-reflective layer and the second dielectric layer.

19. The device of claim 14, wherein the first conductive via has thickness in a range of about 16 kilo-Angstroms to about 60 kilo-Angstroms.

20. The device of claim 14, wherein the first and second dielectric layers are oxide layers.

* * * * *